United States Patent [19]

Zijlstra

[11] Patent Number: 4,695,802

[45] Date of Patent: Sep. 22, 1987

[54] NUCLEAR MAGNETIC RESONANCE APPARATUS WITH A PERMANENT MAGNET

[75] Inventor: Hinne Zijlstra, Eindhoven, Netherlands

[73] Assignee: U.S. Philips Corporation, New York, N.Y.

[21] Appl. No.: 753,205

[22] Filed: Jul. 9, 1985

Related U.S. Application Data

[63] Continuation-in-part of Ser. No. 672,971, Nov. 19, 1984, abandoned.

[30] Foreign Application Priority Data

Jul. 17, 1984 [NL] Netherlands ......................... 8402250

[51] Int. Cl.$^4$ ............................................. G01R 33/20
[52] U.S. Cl. ..................................... 324/319; 324/318
[58] Field of Search ............... 324/300, 307, 318, 319, 324/320, 322; 335/304, 306

[56] References Cited

U.S. PATENT DOCUMENTS

| | | | |
|---|---|---|---|
| 3,768,054 | 10/1973 | Neugebauer | 335/304 |
| 4,411,270 | 10/1983 | Damadian | 324/309 |
| 4,498,048 | 2/1985 | Lee et al. | 324/318 |

Primary Examiner—Michael J. Tokar
Attorney, Agent, or Firm—Robert T. Mayer; Algy Tamoshunas

[57] ABSTRACT

In a nuclear magnetic resonance apparatus the permanent magnetic material of the main magnet is formed by magnetized bars bounded by flat planes which surround a field space with a polygonal cross-section. Fitted around the permanent magnetic material is a return yoke of high-permeability material whose geometry can be matched to the locally prevailing flux. Extra magnetic devices can be fitted to improve the field uniformity in the field space enclosed by the magnetic material.

15 Claims, 12 Drawing Figures

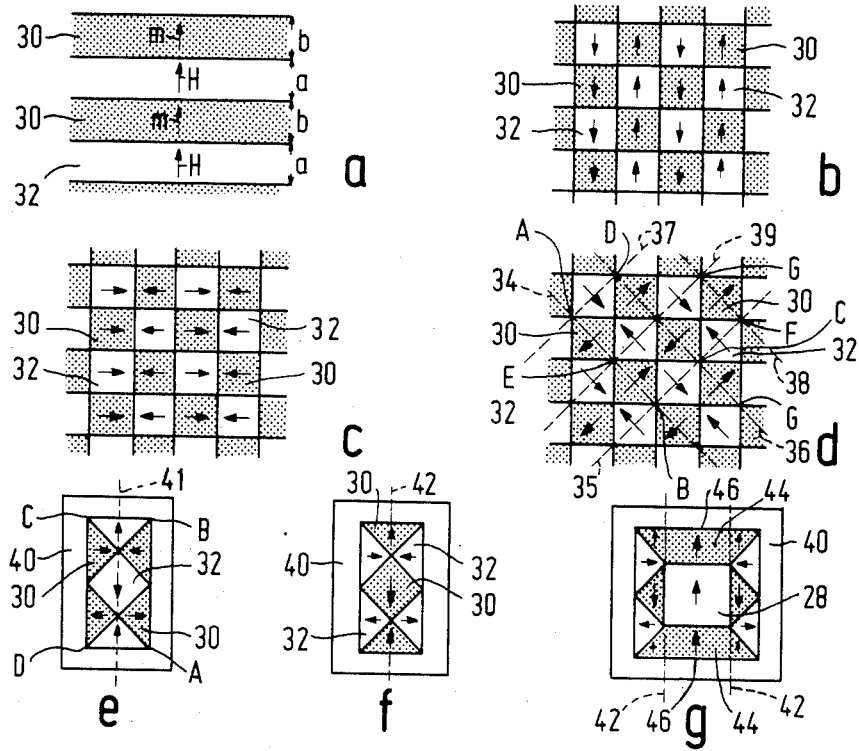
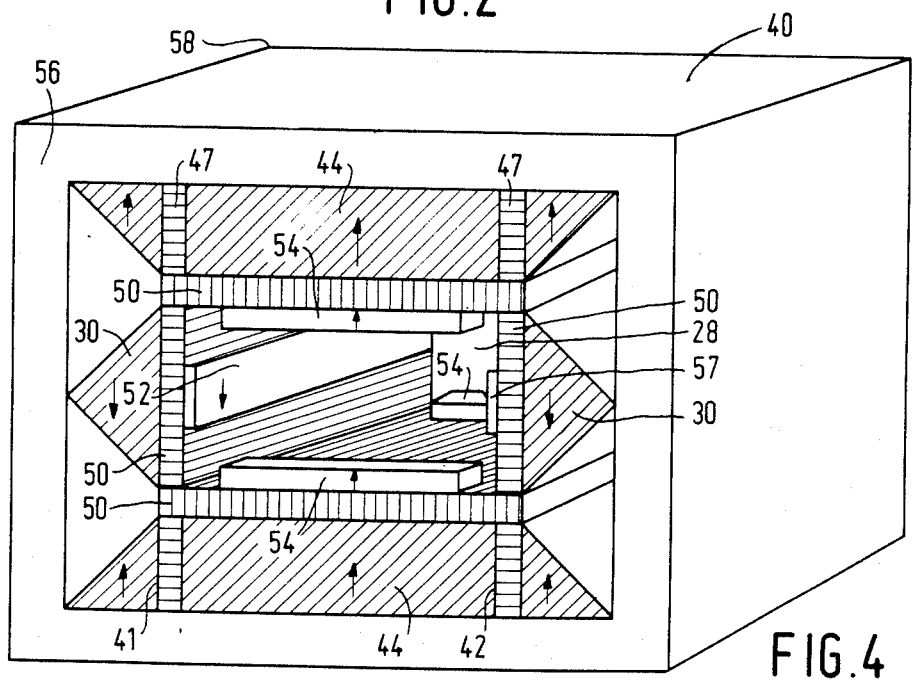
FIG.2
FIG.4 a b c

NUCLEAR MAGNETIC RESONANCE APPARATUS WITH A PERMANENT MAGNET

This is a continuation-in-part of application Ser. No. 672,971 filed Nov. 19, 1984, which is now abandoned.

The invention relates to a nuclear magnetic resonance apparatus with a magnet system containing a permanent magnetic material for generating a uniform main magnetic field, a system of gradient coils and a radio-frequency coil.

An apparatus of this type is known from the PCT patent application No. WO 84/01226. A drawback of the known apparatus is that, since only a slight departure from the desired direction of magnetisation of the permanent magnet material has a disturbing effect on the uniformity of the measurement field, the blocks of material, which are in a form of a composite, are difficult to magnetize sufficiently accurately with respect to direction. With the indicated limited amount of post-alignment of the blocks in a radial direction, any resultant non-uniformity of the field is often difficult to overcome. It is also difficult to build up the magnet in the form of a ring of blocks.

The invention aims at overcoming these disadvantages and therefore relates to a nuclear magnetic resonance apparatus of the type mentioned in the preamble, such that the permanent magnets are formed by laterally magnetized bars, bounded by flat planes. The bars surround, about a longitudinal axis, a magnetic field space which in lateral cross-section is substantially polygonal.

Since the bars of permanent magnetic material, by virtue of their shape, are relatively easy to magnetise directionally, a field space of polygonal cross-section is formed in which the magnetic field possesses sufficient uniformity to enable medical nuclear magnetic resonance examinations to be carried out within a relatively large volume, even without post-alignment of the bars. Moreover, the measurement space can be given a geometry suited to the nature of the examination to be performed.

In a preferred embodiment, the magnet is formed by four bars having as transverse cross-section a right-angle isosceles triangle. The bars are magnetized so that the direction of magnetisation coincides with the bisector of the apex angle. Side faces of the four bars determine a field space of square cross-section which, seen in the length direction, is surrounded by the bars. Both the side and the length dimension of the magnet can be freely chosen, whereby it is preferably for the sake of field uniformity to make the length at least equal to the length of the side and preferably about 1.5 times longer.

In another embodiment, the magnet contains a field space of rectangular cross-section. Two opposite sides of the magnet are formed by the base planes of permanent magnetic bars with a right-angle isosceles triangle as cross-section, the other two sides being formed by flat sides of two intermediate bars with a trapezium as cross-section.

In a further embodiment the magnet contains a field space with a six sided cross-section. Four sides of the magnet are formed by the side planes of permanent magnetic bars with right-angled isosceles triangle as cross-section and the other two sides are formed by flat sides of two intermediate bars with a substantially rectangular cross-section. Each of the permanent magnets thus formed is surrounded by a return yoke of material with a relatively high permeability, fitted to short-circuit and return the magnetic lines of force that occur at this position. With such magnet systems there is consequently no interfering stray field, at least in the lateral direction. The geometry of the return yoke can be matched locally to the prevailing magnetic flux, so that the overall mass of the magnet system can be reduced.

By the addition of extra magnetic provisions in the form of permanent magnets, ferromagnetic members or electromagnetic coils or by adapted spacings between the bars of permanent magnetic material, the field uniformity in the measurement space can be increased or the useful measurement space enlarged. With these aids it is also possible to improve specifically the uniformity of the main field in the field space near to one of the longitudinal end planes.

By cladding the field space with a strongly anisotropic magnetic material, the effects of local disturbances in the direction of magnetisation on the field uniformity in the measurement space can be neutralised.

In a further embodiment the gradient coils of the apparatus, which are necessary for the measurement and subsequent display, can be incorporated in spaces that occur as a result of the chosen configuration of the permanent magnetic material in the magnet system. At the usual operating frequencies of the gradient coils, the permanent magnetic material will have a sufficiently low screening factor to permit such an arrangement provided that ferrite is used.

In the following some preferred embodiments in accordance with the invention will be described in more detail with reference to the drawings, in which:

FIG. 2a shows in lateral cross-section spaced apart plates of permanent magnetic material;

FIG. 2b shows another conjunction of bar magnets;

FIG. 2c shows the configuration of FIG. 2b rotated through 90°;

FIG. 2d shows a configuration resulting from superposition of the configurations shown in FIGS. 2b and 2c;

Figure 3:
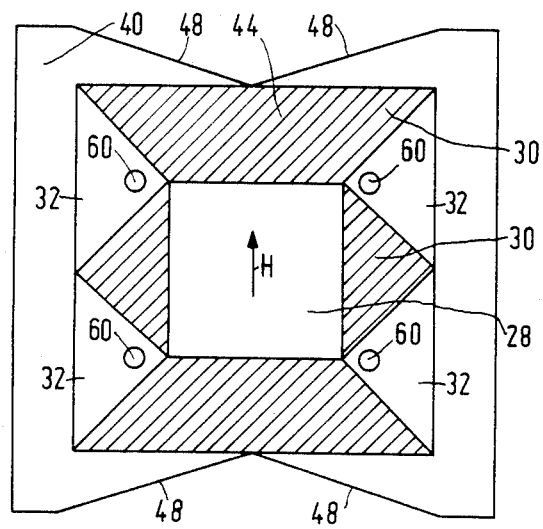
Figure 3:
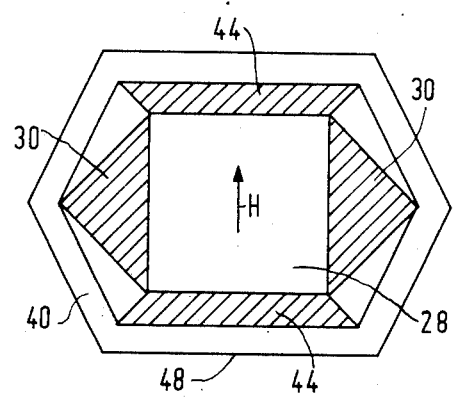
Figure 3:
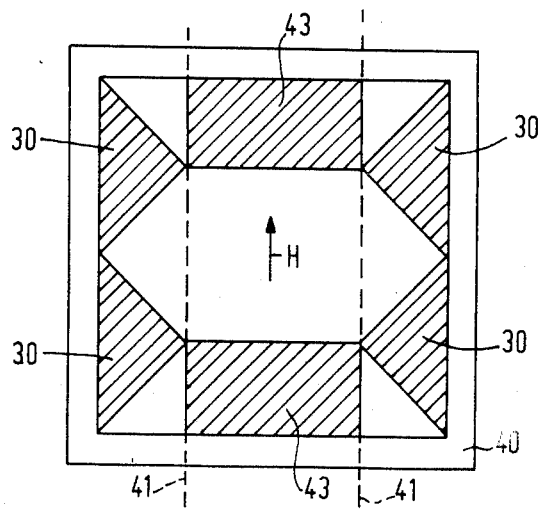

FIG. 2e diagrammatically shows a cross-section of a magnet system derived from the configuration shown in FIG. 2e;

FIG. 2f diagrammatically illustrates the cross-section of another magnet system derived from the configuration of FIG. 2d;

FIG. 2g diagrammatically illustrates the cross-section of a magnet system derived from FIG. 2f;

FIG. 3a shows, in cross-section, an embodiment of a magnet system in accordance with the invention;

FIG. 3b shows, in cross-section, another embodiment of a magnet system in accordance with the invention;

FIG. 3c shows, in cross-section, a further embodiment of a magnet system in accordance with the invention.

FIG. 4 shows such a magnet system provided with field connecting magnetic devices.

Figure 1:
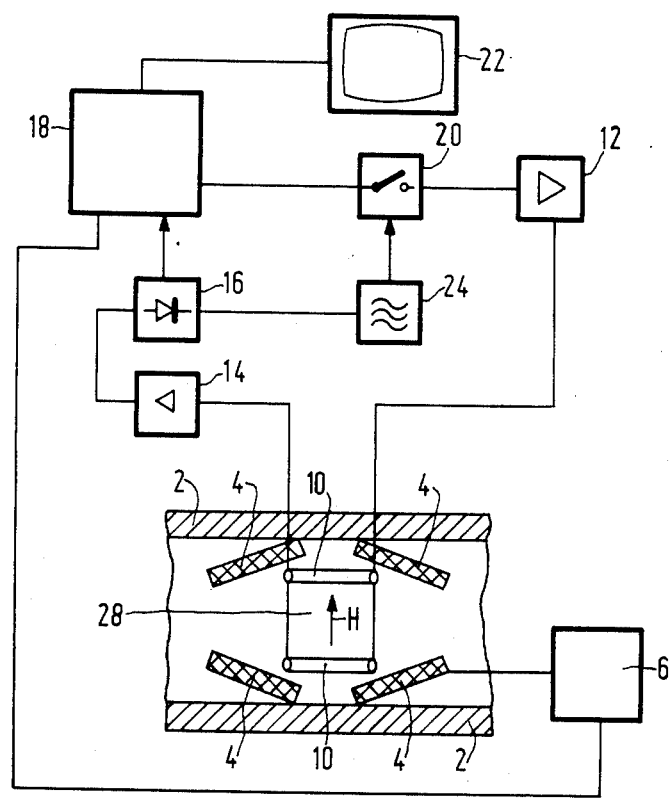
FIG. 1 shows a nuclear magnetic resonance apparatus provided with a permanent magnet in accordance with the invention.

A nuclear magnetic resonance apparatus shown in FIG. 1 contains a permanent magnet system 2 for generating a steady uniform magnetic field H, a magnetic system 4 for generating magnetic gradient fields, usually formed by a three-axis electromagnetic coil system, a power source 6 for the system of gradient coils 4 and a radio-frequency excitation coil 10 for generating a radio-frequency alternating electromagnetic field for which purpose the coil 10 is connected to a radio-frequency source 12. The coil 10 may also be used for detecting nuclear magnetic resonance signals generated by the radio-frequency field in an object under examination. Accordingly as shown in FIG. 1, of the radio-frequency coil 10 is also connected to a signal amplifier 14. The signal amplifier 14 is connected to a phase-sensitive rectifier 16 which is connected to a central control unit 18. The central control unit 18 also controls a modulator 20 for the radio-frequency source 12, the power source 6 for the gradient coils and a monitor 22 for the display. A high-frequency oscillator 24 controls both the modulator 20 and the phase-sensitive rectifier 16 which processes the measurement signals. The excitation coil 10, placed inside the magnet system 2 and 4, surrounds and defines a measurement space 28 which, in an apparatus for so-called total body nuclear magnetic resonance measurements, is large enough to contain a patient. Thus there must be generated in the measurement space 28 a steady uniform magnetic field H, gradient fields for defining those sectional regions of an object under examination which are to be measured and displayed, and a spatially uniform radio-frequency alternating field for generating nuclear magnetic resonance signals. For certain examinations such as those to be carried out on the more peripheral parts of the body, and also, for example, for examination of the spinal cord, it may be more advantageous to use separate radio-frequency detection coils whose shape can be matched to the part of the body under examination. For example, instead of coil 10, may be used surface coils for local body examination, for example cardiac and spinal cord examinations, or solenoid-type coils into which more peripheral parts of the body can be introduced. The latter would include more specially examinations of arms, legs and breast. The detection coil is then included in a measurement space in which the exciation coil can generate a locally uniform radio-frequency field or in which the measurement coil itself can produce that radio-frequency field. For this application in particular it is often desirable that the main magnetic field should be sufficiently uniform close to one of the axial ends of the magnet system.

FIG. 2 shows schematically how, on the basis of laterally magnetised plates of permanent magnetic material, different magnet configurations can be built up for specific purposes.

FIG. 2a shows in lateral cross-section plates of permanent magnetic material 30 each of thickness b, arranged at a mutual distance a. For simplicity, in the arrangement shown in FIG. 2a it is shown that a=b, but that is not a necessary condition for the validity of the following discussion. The plates 30 are magnetized along the direction of the arrows m. As a result, a magnetic field H is generated in spaces 32 between the plates. If the extent of the plates 30 is made large the field H between the plates will be uniform to a high degree. In such a system no change will take place in the magnetic field in the spaces 32, nor in the magnetization in the material, when the distribution of the permanent magnets 30 and the intermediate spaces 32 are changed to the configuration shown in FIG. 2b. This will also apply if the system in FIG. 2b is converted by a rotation of 90 degrees in the plane of the drawing into the configuration shown in FIG. 2c. A permissible superposition of the configurations shown respectively in FIGS. 2b and 2c results in the configuration shown in FIG. 2d. A part of the configuration shown in FIG. 2d cut out along the dashed lines 34, 35, 36 and 37 with corner points A, B, C and D results in a magnet with a cross-section as indicated in FIG. 2e. Using a return yoke 40 of material with a high magnetic permeability, a lateral cross-section of which can be locally matched to the magnetic flux prevailing at any given point, a useful magnet system has been produced. In dimensioning the return yoke it is advantageous to select a flux value which is no greater than approximately half the saturation magnetisation of the material. Outside the return yoke there will then be no interfering stray magnetic field. For total body examinations the side of the square field space 32 shown here in cross-section has a length of for example 0.75 m; for peripheral examinations a side of for example about 0.25 m is sufficient.

A part of the configuration of FIG. 2d along dashed lines 34, 35, 38 and 39 with corner points E, B, F and G results in a configuration as indicated in FIG. 2f. This configuration when divided along a line 42 and after the interposition of connecting pieces in the form of spacing magnets 44 with a magnetisation whose intensity is equal to that of the triangles divided by the line 42, results in a useful magnet system with a field space 28 as indicated in FIG. 2g. Around the magnet system there is provided, as before, a return yoke 40 of material having a high permeability. The return yoke 40 can be reduced from the viewpoint of the conduction of magnetic flux to a zero thickness adjacent the middle 46 of the spacing magnets 44, because no magnetic flux will be present at this location. For this reason the yoke can be given the shape indicated by the lines 48 in FIG. 3a. The mass of the return yoke can thus be reduced, resulting in a magnet as shown in FIG. 3a. On the other hand, while maintaining sufficient uniformity in the magnetic field H, in the field space 28, the permanent spacing magnets 44 can be given a different shape, for example, made thinner, in the radial direction, i.e. in the direction of magnetization. As a result, however, the value of the magnetic field will change. By matching the return yoke 40 to the resultant geometry of the permanent magnetic material, a magnetic system as indicated in FIG. 3b is obtained. Here too, incidentally, the thickness of the yoke 40 can be reduced in a corresponding manner adjacent the centre of each of the outer faces of the spacing magnets 44.

Similarly, on the basis of FIG. 2e, a magnet having a configuration as shown in FIG. 3c can be realized by division along a dividing line 41 and addition of intermediate pieces 43 and another yoke 40. In accordance with the geometries shown in the FIGS. 3a and 3b, yoke material can again be saved or the mass of the permanent magnetic material can be optimized. The advantage of configurations based on that shown in FIG. 3c consists mainly in the considerably more attractive ratio of useful open space and total open space as can be deduced directly from the configuration shown.

In order to reduce the total mass, the length of magnets formed in accordance with the foregoing can be limited in the axial direction to for example about 1.5 to 2 times the relevant cross-section dimension of the field space of the permanently magnetized bars. When the cross-section is decreased, the mass reduction is approximately proportional to the third power of the linear dimensions, since the length can then also be reduced. The line of thought as described above with reference to FIG. 2 for one dimension; can also be applied to three dimensions, so that an octahedral magnet is produced with a field space in which, apart from irregularities in the permanent magnet material, an ideal degree of field uniformity is obtained. The measurement space is then, however, enclosed on all sides by permanent magnetic material or by yoke material and is thus not accessible to objects that are to be examined.

An example of a magnet of limited length is given in FIG. 4. In cross-section, this magnet corresponds substantially to the magnet sketched in FIG. 3a. Here too, the return yoke 40 can be reduced. The uniformity of the magnetic field in the field space 28 is improved here by the addition of a cladding layer 50 of a strongly anisotropic soft magnetic material. In a practical implementation, this material is composed, for example, of a laterally oriented structure of lamellae formed alternately of magnetic material of high permeability and of non-magnetic material. This cladding layer neutralises field non-uniformities in the bars 30 and 44, respectively. Strips of permanent magnetic material such as lengthwise strips 52 and crosswise strips 54 are applied to reduce the negative effect of the finite length of the field space. For this purpose, an electromagnetic coil can alternatively be used, placed near an end face 56 or near both end faces 56 and 58. The advantage of a coil is that it enables the degree of uniformity of the field to be matched rapidly and optimally to the requirements of the user on the spot. For example the field uniformity near an end face can be improved, possibly at the expense of the uniformity nearer the centre. The same improvement can also be realised with the magnetic strips. But that is then no longer adjustable. For reasons of symmetry, it may be advantageous to let the cladding layer, as indicated in the present example, extend along the intersection planes of the dividing lines 42, but that is not necessary.

In the permanent magnets built up in accordance with the invention, there are empty spaces that cannot effectively be used. In a practical implementation, the gradient coils required for sectional measurement and subsequent display can be accommodated in these spaces. Since the gradient coils do not then need to be incorporated in the field space to be effectively used, the field space can be made smaller, so that a gain is achieved as regards the mass of the magnet while maintaining accessibility and field strength. FIG. 3a shows very schematically how gradient coils 60 can be incorporated in clear spaces in the magnet system.

What is claimed is:

1. A nuclear magnetic resonance apparatus comprising first means for generating homogeneous, main magnetic field in a magnetic field space, second means for generating at least one magnetic gradient field in said field space, means for generating a radio frequency field in said field space and means for detecting a nuclear magnetic resonance signal produced by said radio frequency field in an object under examination disposed in said field space, said first means comprising a plurality of bars of a permanent magnetic material, said bars being laterally magnetized and having planar side surfaces, said bars being disposed about and surrounding an axis extending centrally along said field space so as to define the periphery of said field space having a polygonal cross-section in a plane normal to said axis, with each axially extending peripheral surface of said field space being constituted by a planar surface of a respective bar.

2. The apparatus according to claim 1 wherein said first means is comprised of four of said bars, each bar having a triangular cross-section, and wherein said bars are arranged about said axis such that the cross-section of said field space is rectangular.

3. The apparatus according to claim 2 wherein said cross-section of each of said bars is a right-angle isoceles triangle and wherein said bars are arranged about said axis so that the cross-section of said field space is a square, each of said bars being magnetized in the direction of the bisector of the apex angle of said triangular cross-section thereof.

4. The apparatus according to claim 1 wherein said first means is comprised of two bars having a triangular cross-section and two bars having a trapezoidal cross-section, said bars being arranged about said axis such that said cross-section of said field space is rectangular.

5. The apparatus according to claim 1 wherein said first means is comprised of four bars each having a triangular cross-section and two bars having a rectangular cross-section, said bars being arranged about said axis such that said cross-section of said field space is hexagonal.

6. The apparatus according to claim 5 wherein said triangular cross-section of each of said four bars is a right-angle isoceles triangle.

7. The apparatus according to claims 1, 2, 3, 4 or 5 including a return yoke of a material with a relatively high permeability disposed about said bars.

8. The apparatus according to claim 1 including means for modifying the magnetic field produced by said bars in the region adjacent the axial ends of said field space so as to improve the uniformity of said main magnetic field.

9. A magnet system for producing a homogeneous, main magnetic field in a magnetic field space of a nuclear magnetic resonance apparatus, said magnet system comprising a plurality of bars of a permanent magnetic material, said bars being laterally magnetized and having planar side surfaces, said bars being disposed about and surrounding an axis extending centrally along said field space so as to define the periphery of said field space having a polygonal cross-section in a plane normal to said axis, with each axially extending peripheral surface of said field space being constituted by a planar surface of a respective bar.

10. Nuclear magnetic resonance apparatus as claimed in claim 7, wherein the local cross-section of the return yoke at right angles to the locally prevailing magnetic flux is matched to the strength of that flux.

11. Nuclear magnetic resonance apparatus as claimed in claims 1, 2, 4 or 7 wherein that part of the field space which is surrounded by the bars is clad with a strongly anisotropic magnetic material.

12. Nuclear magnetic resonance apparatus as claimed in claim 11, in which the cladding material has a laterally oriented lamellar structure consisting alternately of high-permeability magnetic material and of non-magnetic material.

13. Nuclear magnetic resonance apparatus as claimed in claim 4 in which the trapezoidal bars have, in the direction of magnetisation, a dimension smaller than the height of the triangular bars.

14. Nuclear magnetic resonance apparatus as claimed in claim 1, in which the lengths of the bars are limited to the range of from one to two times the field space cross-section formed by the permanent magnetic bars and including further magnetic means for improving the field uniformity in the field space.

15. Nuclear magnetic resonance apparatus as claimed in claim 14, in which said further magnetic means are adapted to give an improvement of field uniformity nearer at least one of the end faces of the magnet.

* * * * *